United States Patent
Kusunose et al.

(10) Patent No.: US 11,353,802 B2
(45) Date of Patent: Jun. 7, 2022

(54) OPTICAL DEVICE, AND METHOD FOR PREVENTING CONTAMINATION OF OPTICAL DEVICE

(71) Applicant: Lasertec Corporation, Kanagawa (JP)

(72) Inventors: Haruhiko Kusunose, Yokohama (JP); Tsunehito Kohyama, Yokohama (JP)

(73) Assignee: Lasertec Corporation, Yokohama (JP)

( * ) Notice: Subject to any disclaimer, the term of this patent is extended or adjusted under 35 U.S.C. 154(b) by 0 days.

(21) Appl. No.: 17/329,042

(22) Filed: May 24, 2021

(65) Prior Publication Data

US 2021/0373447 A1    Dec. 2, 2021

(30) Foreign Application Priority Data

May 26, 2020 (JP) ............................. JP2020-091264

(51) Int. Cl.
    *G03F 7/20* (2006.01)
(52) U.S. Cl.
    CPC ...... *G03F 7/70983* (2013.01); *G03F 7/70316* (2013.01); *G03F 7/70958* (2013.01)
(58) Field of Classification Search
    CPC ............ G03F 7/70983; G03F 7/70316; G03F 7/70958; G03F 7/70233; G03F 7/702; G03F 7/70883; G03F 7/70841; G03F 7/70916; G03F 7/7085; G03F 7/70975; G03F 7/70925; G03F 7/70941; G03F 1/24; H01L 21/027; G01B 11/0625; B82Y 10/00; B82Y 40/00; G03B 27/16; G21K 2201/061; G21K 1/062; G02B 5/0891; G02B 5/0825
    See application file for complete search history.

(56) References Cited

U.S. PATENT DOCUMENTS

| 2010/0288302 A1* | 11/2010 | Ehm | ........................ B08B 5/02 134/1.1 |
| 2012/0250144 A1 | 10/2012 | Ehm et al. | |
| 2019/0155178 A1* | 5/2019 | Lin | ..................... G03F 7/70708 |

FOREIGN PATENT DOCUMENTS

| JP | 2012256944 A | 12/2012 | |
| JP | 2013506308 A | 2/2013 | |
| KR | 20040034524 A | * 4/2004 | ............. G03F 7/702 |

OTHER PUBLICATIONS

KR 20040034524 A.*

* cited by examiner

Primary Examiner — Mesfin T Asfaw
(74) Attorney, Agent, or Firm — McCoy Russell LLP

(57) ABSTRACT

Provided are an optical device capable of effectively preventing contamination and a method for preventing contamination of the same. An optical device according to an embodiment includes a light source that generates light containing EUV (Extreme UltraViolet) light or VUV (Vacuum UltraViolet) light, a chamber in which an object to be irradiated with the light is placed, an optical element placed inside the chamber to guide the light, an introduction unit that introduces hydrogen or helium into the chamber, a power supply that applies a negative voltage to the optical element in the chamber, an ammeter that measures an ion current flowing through the optical element, and a control unit that adjusts the amount of the hydrogen or the helium introduced according to a measurement result of the ammeter.

14 Claims, 3 Drawing Sheets

OPTICAL DEVICE, AND METHOD FOR PREVENTING CONTAMINATION OF OPTICAL DEVICE

CROSS REFERENCE TO RELATED APPLICATION

The present application claims priority to Japanese Patent Application No. 2020-91264, filed on May 26, 2020. The entire contents of the above-listed application is hereby incorporated by reference for all purposes.

BACKGROUND

The present disclosure relates to an optical device, and a method for preventing contamination of an optical device.

A reflective optical element for reducing contamination in an EUV lithography device is proposed in Published Japanese Translation of PCT International Publication for Patent Application, No. 2013-506308. In this literature, cleaning gas such as atomic hydrogen, hydrogen molecules, or helium is added to the EUV lithography device.

A method for removing a contamination layer from an optical surface is disclosed in Japanese Unexamined Patent Application Publication No. 2012-256944. In this literature, cleaning gas containing atomic hydrogen is brought into contact with a contamination layer. One of cleaning heads uses helium as sputtering gas. A potential difference between an EUV reflective optical element and a cleaning head is generated by a voltage generator. This potential difference causes acceleration of helium ions in a cleaning gas jet.

SUMMARY

Since EUV light is absorbed by air or nitrogen, an optical system of EUV light is operated in a vacuum chamber. During operation, organic residual gas generated from lubricating oil used in a mechanism component, an electrical wiring material or the like is absorbed to the surface of an optical component. When EUV light is applied thereto, organic molecules are decomposed, and thereby carbon is attached to the surface of the component, which deteriorates the reflectance of a mirror.

The present disclosure has been accomplished to solve the above problems and an object of the present disclosure is thus to provide an optical device capable of effectively preventing contamination of an optical element, and a method for preventing contamination of the same.

An optical device according to one aspect of the present embodiment includes a light source configured to generate light containing EUV (Extreme UltraViolet) light or VUV (Vacuum UltraViolet) light, a chamber where an object to be irradiated with the light is placed, an optical element placed inside the chamber to guide the light, an introduction unit configured to introduce hydrogen or helium into the chamber, a power supply configured to apply a negative voltage to the optical element in the chamber, an ammeter configured to measure an ion current flowing through the optical element, and a control unit configured to adjust an amount of the hydrogen or the helium introduced according to a measurement result of the ammeter.

In the above-described optical device, the introduction unit may include an introduction pipe connected to the chamber, and the control unit may adjust a gas flow rate of the hydrogen or the helium supplied to the introduction pipe.

In the above-described optical device, the introduction unit may include a remote plasma generation device configured to generate plasma of the hydrogen or the helium, an introduction pipe placed between the remote plasma generation device and the chamber, and a variable conductance valve mounted on the introduction pipe, and the control unit may adjust conductance of the variable conductance valve.

In the above-described optical device, a cooling mechanism configured to cool the introduction pipe may be placed.

In the above-described optical device, the object may be an EUV mask with a pellicle.

In the above-described optical device, an oblique-incidence mirror configured to reflect the VUV light may be placed inside the chamber, and the VUV light reflected on the oblique-incidence mirror may enter the optical element.

In the above-described optical device, the introduction unit may introduce helium gas or helium plasma into the chamber.

A method for preventing contamination according to one aspect of the present embodiment is a method for preventing contamination of an optical device including a light source configured to generate light containing EUV light or VUV light, a chamber where an object to be irradiated with the light is placed, and an optical element placed inside the chamber to guide the light, the method including a step of introducing hydrogen or helium into the chamber, a step of applying a negative voltage to the optical element in the chamber, a step of measuring an ion current flowing through the optical element, and a step of adjusting an amount of the hydrogen or the helium introduced according to a measurement result of the ion current.

In the above-described method for preventing contamination, an introduction pipe may be connected to the chamber, and a gas flow rate of the hydrogen or the helium supplied to the introduction pipe may be adjusted according to the measurement result.

In the above-described method for preventing contamination, the optical device may include a remote plasma generation device configured to generate plasma of the hydrogen or the helium, an introduction pipe placed between the remote plasma generation device and the chamber, and a variable conductance valve mounted on the introduction pipe, and conductance of the variable conductance valve may be adjusted according to the measurement result.

In the above-described method for preventing contamination, a cooling mechanism configured to cool the introduction pipe may be placed in the optical device.

In the above-described method for preventing contamination, the object may be an EUV mask with a pellicle.

In the above-described method for preventing contamination, an oblique-incidence mirror configured to reflect the VUV light may be placed inside the chamber, and the VUV light reflected on the oblique-incidence mirror may enter the optical element.

In the above-described method for preventing contamination, helium gas or helium plasma may be introduced into the chamber.

According to the present disclosure, there are provided an optical device capable of effectively preventing contamination of an optical element, and a method for preventing contamination of the same.

The above and other objects, features and advantages of the present disclosure will become more fully understood from the detailed description given hereinbelow and the accompanying drawings which are given by way of illustration only, and thus are not to be considered as limiting the present disclosure.

DETAILED DESCRIPTION

Embodiments of the present disclosure will be described hereinbelow with reference to the drawings. The explanation provided hereinbelow merely illustrates a preferred embodiment of the present disclosure, and the present disclosure is not limited to the below-described embodiment. In the following description, the identical reference symbols denote substantially identical elements.

First Embodiment

Figure 1:
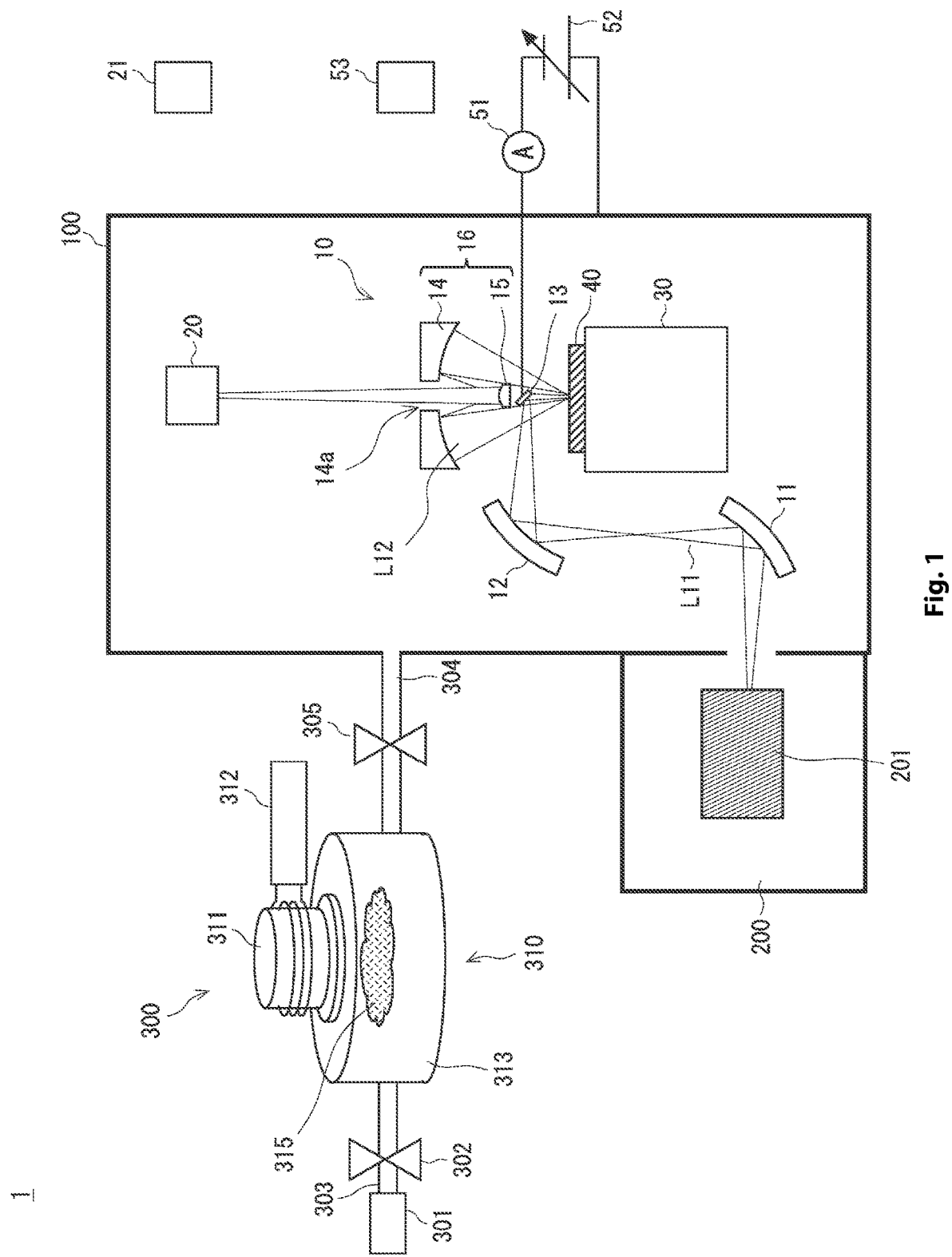
FIG. 1 is a schematic diagram showing the overall structure of an inspection device according to a first embodiment.

Embodiments of the present disclosure will be described hereinbelow with reference to the drawings. First, the overall structure of an optical device according to an embodiment will be described hereinafter with reference to FIG. 1. In this embodiment, an optical device is an inspection device 1 that inspects an EUV (Extreme UltraViolet) mask by using EUV light. Thus, a sample 40 is the EUV mask. Note that the EUV mask that serves as the sample 40 may be a patterned mask or a mask blank with no pattern.

Device Structure

An inspection device 1 according to this embodiment includes an optical system chamber 100, a light source chamber 200, and an introduction unit 300.

The light source chamber 200 is a vacuum chamber, and it is connected to a vacuum pump, which is not shown. A light source 201 is placed in the light source chamber 200.

The light source 201 is an EUV light source that generates EUV light or VUV light. In this example, the light source 201 generates EUV light with a wavelength of 13.5 nm, which is the same as the exposure wavelength of the sample 40 to be irradiated. The light generated from the light source 201 is referred to as irradiation light L11. The light source 201 is a DPP (Discharge Produced Plasma) light source using electric discharge, for example. The light source 201 may generate VUV (Vacuum UltraViolet) light, which is out-of-bounds light. The light source 201 may be any type of light source as long as it generates light that contains at least one of VUV light and EUV light. Note that VUV light may be light with a wavelength of 100 nm to 200 nm.

The optical system chamber 100 is a vacuum chamber, and it is connected to a vacuum pump, which is not shown. The optical system chamber 100 is connected to the light source chamber 200. Since the internal space of the light source chamber 200 and the optical system chamber 100 is vacuum, EUV light propagates in vacuum. Note that evacuation of the light source chamber 200 and the optical system chamber 100 may be done through a common vacuum pump or through separate vacuum pumps.

In the optical system chamber 100, an optical system 10, a stage 30, a photodetector 20, and the sample 40 are placed. The optical system 10 causes the irradiation light L11, which is EUV light, to propagate. The optical system 10 includes a concave mirror 11, a concave mirror 12, a dropping mirror 13, and a Schwarzschild optical system 16. The optical system 10 is a dark-field optical system for imaging the sample 40. The sample 40 is placed in the optical system chamber 100. The sample 40 is an object to be irradiated with the irradiation light L11.

The optical system 10 to guide EUV light is described hereinafter. The irradiation light L11 generated by the light source 201 proceeds as spreading out. The irradiation light L11 generated by the light source 201 is reflected on the concave mirror 11. The concave mirror 11 is a spheroidal mirror, for example. The concave mirror 11 is a multi-layer mirror in which an Mo film and an Si film are alternately stacked, and it reflects EUV light. The irradiation light L11 reflected on the concave mirror 11 proceeds as being narrowed down. After the irradiation light L11 comes to a focus, it proceeds as spreading out. Then, the irradiation light L11 is reflected on the concave mirror 12.

The concave mirror 12 is a spheroidal mirror, for example. The concave mirror 12 is a multi-layer mirror in which an Mo film and an Si film are alternately stacked, and it reflects EUV light. The irradiation light L11 reflected on the concave mirror 12 proceeds as being narrowed down, and then enters the dropping mirror 13. The dropping mirror 13 is a plane mirror and placed directly above the sample 40. The irradiation light L11 reflected on the dropping mirror 13 enters the sample 40. The dropping mirror 13 focuses the irradiation light L11 on the sample 40. In this manner, an inspection area of the sample 40 is illuminated by the irradiation light L11, which is EUV light. Thus, the irradiation light L11 is illumination light that illuminates the sample 40.

The stage 30 is placed in the optical system chamber 100. The sample 40 is placed on top of the stage 30. The stage 30 is a drive stage such as an XYZ stage. The stage 30 moves in an XY-plane which is perpendicular to the optical axis, and the ample 40 moves accordingly. The illuminated position of the sample 40 thereby changes, which allows observing an arbitrary position of the sample 40. This allows changing the inspection area in which the sample 40 is illuminated.

A detection optical system that detects light from the sample 40 is described hereinafter. As described above, the irradiation light L11 illuminates the inspection area of the sample 40. EUV light that is reflected on the sample 40 is referred to as detection light L12. The detection light L12 reflected on the sample 40 enters the Schwarzschild optical system 16. The Schwarzschild optical system 16 includes a convex mirror 14 with a hole and a convex mirror 15 that are placed above the sample 40.

The detection light L12 reflected on the sample 40 enters the convex mirror 14 with a hole. The convex mirror 14 with a hole has a hole 14a in its center. The detection light L12 reflected on the convex mirror 14 with a hole enters the convex mirror 15. The convex mirror 15 reflects the detection light L12 from the convex mirror 14 with a hole towards the hole 14a of the convex mirror 14 with a hole. The detection light L12 that has passed through the hole 14a of the convex mirror 14 with a hole enters the photodetector 20. The inspection area of the sample 40 is projected in a magnified scale on the photodetector 20 by the Schwarzschild optical system 16.

The detection light L12 reflected on the convex mirror 15 is detected by the photodetector 20. The photodetector 20 is an imaging device such as a CCD (Charge Coupled Device) sensor, a CMOS (Complementary Metal Oxide Semiconductor) sensor, or a TDI (Time Delay Integration) sensor, and it takes an image of the sample 40. The photodetector 20 takes a magnified image of the inspection area of the sample 40.

The image of the sample 40 taken by the photodetector 20 is output to a processing device 21. The processing device 21 is an arithmetic processing unit that includes a processor, a memory and the like, and conducts inspection on the basis of the image of the sample 40. For example, the processing device 21 performs defect inspection by comparing the luminance of the image of the sample 40 with a threshold. Further, the processing device 21 controls the coordinates of the stage 30. Defect coordinates of the sample 40 are thereby identified. Then, the processing device 21 stores the defect coordinates and an image of the defect into a memory or the like. The processing device 21 displays the image of the defect or the like on a monitor. A user thereby recognizes the defect.

Prevention of Contamination

Mechanism components and electrical wiring materials are placed inside the optical system chamber 100 and the light source chamber 200. Organic residual gas is generated from lubricating oil used in a mechanism component, an electrical wiring material and the like and is absorbed to the surface of an optical element. When EUV light is applied to the optical element, carbon is deposited on the surface of the optical element. Therefore, in this embodiment, the introduction unit 300 is provided in order to remove contamination of the optical element.

An example of preventing contamination of the dropping mirror 13 is described hereinbelow. The irradiation light L11 reflected on the concave mirror 12 proceeds as being narrowed down. Thus, a spot of the irradiation light L11 is small in the dropping mirror 13. The light density of the irradiation light L11 is high in the dropping mirror 13, which promotes the contamination of the dropping mirror 13. Thus, in this embodiment, the dropping mirror 13 is an optical element whose contamination is to be prevented.

The inspection device 1 includes the introduction unit 300, an ammeter 51, a power supply 52, and a control unit 53. The dropping mirror 13 is placed inside the optical system chamber 100. The introduction unit 300 is connected to the optical system chamber 100. The ammeter 51, the power supply 52, and the control unit 53 are placed outside the optical system chamber 100.

The introduction unit 300 introduces helium plasma into the optical system chamber 100. The introduction unit 300 includes a gas supply source 301, an MFC (Mass Flow Controller) 302, a gas pipe 303, an introduction pipe 304, a variable conductance valve 305, and a plasma generation device 310. The plasma generation device 310 generates remote plasma.

The gas supply source 301 includes a gas cylinder or the like that stores helium gas (He gas). The gas supply source 301 is connected to the plasma generation device 310 through the gas pipe 303. The gas supply source 301 supplies He gas to the plasma generation device 310. He gas from the gas supply source 301 is introduced into the plasma generation device 310 through the gas pipe 303. A plasma chamber 313 in the plasma generation device 310 is thereby filled with He gas. The gas pipe 303 is provided with the MFC 302. The MFC 302 controls the flow rate of He gas.

The plasma generation device 310 includes a coil 311, an RF (Radio Frequency) power supply 312, and the plasma chamber 313. The plasma chamber 313 is a vacuum chamber, and it is connected to a vacuum pump, which is not shown. The plasma chamber 313 is filled with He gas from the gas supply source 301. The RF power supply 312 supplies an RF voltage to the coil 311. A current thereby flows through the coil 311, and a magnetic field is generated in the plasma chamber 313. He molecules ionize into helium ion ($He^+$) and electrons, and thereby plasma 315 is generated. The plasma 315 may be generated by capacitive coupling, not limited to inductive coupling. The plasma 315 may be generated by using RF glow discharge. Alternatively, ECR (Electron Cyclotron Resonance) plasma may be used.

The introduction pipe 304 is connected to the plasma chamber 313. Further, the introduction pipe 304 is connected to the optical system chamber 100. Thus, the plasma chamber 313 is connected to the optical system chamber 100 through the introduction pipe 304. The plasma 315 generated in the plasma chamber 313 is introduced into the optical system chamber 100 through the introduction pipe 304. The introduction pipe 304 is provided with the variable conductance valve 305. The conductance (opening degree) of the variable conductance valve 305 is variable.

The control unit 53 changes the opening degree of the variable conductance valve 305. This allows adjusting the amount of the plasma 315 introduced. For example, the amount of the plasma 315 introduced increases by increasing the conductance of the variable conductance valve 305. On the contrary, the amount of the plasma 315 introduced decreases by reducing the conductance of the variable conductance valve 305. Further, the control unit 53 may control the RF power supply 312. This allows controlling the density of the plasma 315 and thereby adjusting the amount of the plasma 315 introduced.

In this manner, the introduction unit 300 introduces the plasma 315 into the optical system chamber 100. Specifically, the plasma generation device 310 generates the plasma 315. The plasma 315 that contains electrons, helium ions, helium gas, radical or the like is introduced into the optical system chamber 100.

The dropping mirror 13 is connected to the power supply 52. The power supply 52 is a DC (Direct Current) power supply, and generates a DC voltage. The power supply 52 supplies a negative DC voltage to the dropping mirror 13. For example, the optical system chamber 100 has a ground potential, and the dropping mirror 13 has a negative potential. A DC voltage is applied between the optical system chamber 100 and the dropping mirror 13. Thus, an electric field is generated around the dropping mirror 13, and thereby He ions are accelerated.

He ions contained in the plasma 315 collide with the dropping mirror 13. This prevents contamination of the dropping mirror 13. As a result that the He ions are accelerated by the electric field and collide with the surface of the optical element, carbon is removed. This suppresses the deterioration of the reflectance of the dropping mirror 13.

A negative DC voltage applied to the dropping mirror 13 is preferably at a level that does not cause damage to the dropping mirror 13 due to collision of ions. For example, a voltage of −50V to −100V is applied to the dropping mirror 13. This effectively removes carbon attached to the surface of the dropping mirror 13.

The ammeter 51 is connected between the power supply 52 and the dropping mirror 13. The ammeter 51 monitors a current flowing from the power supply 52 to the dropping mirror 13. To be specific, since He ions collide with the dropping mirror 13, a current flows from the dropping mirror 13 to the power supply 52. Thus, the ammeter 51 measures an ion current that has collided with the dropping mirror 13.

The control unit 53 controls the amount of the plasma 315 introduced according to a measurement result of the ammeter 51. For example, the control unit 53 controls the opening of the variable conductance valve 305 according to a measurement result of the ammeter 51. Alternatively, the control unit 53 controls the output of the RF power supply 312 according to a measurement result of the ammeter 51. The control unit 53 may control both of the variable conductance valve 305 and the RF power supply 312, or may control only one of them. The control unit 53 controls the amount of the plasma 315 introduced on the basis of a current value measured by the ammeter 51.

A target value is set to the control unit 53 so as reach an ion current corresponding to the surface area of the optical element. The control unit 53 performs feedback control of the variable conductance valve 305 or the RF power supply 312 so that the ion current measured by the ammeter 51 reaches the target value. Note that, when EUV light is applied to the dropping mirror 13, a photoemission current is superimposed on a measurement current. To avoid this, it preferred to set a target value in the state where EUV light is not applied to the dropping mirror 13.

An electric field is generated around the dropping mirror 13 by a negative DC voltage applied to the dropping mirror 13. This electric field causes He ions to be accelerated and collide with the surface of the dropping mirror 13. The He ions collide with molecules of residual gas absorbed on the surface of the dropping mirror 13. If the bombardment force of the collision is sufficiently higher than the adsorbability of the residual gas molecules, the adsorbed molecules come off the surface of the dropping mirror 13. Consequently, a clean reflective surface is formed on the surface of the dropping mirror 13.

When adsorbed gas molecules are decomposed by irradiation of EUV light, carbon is generated. In this embodiment, He plasma is introduced into the optical system chamber 100 during irradiation of the irradiation light L11. Thus, most of adsorbed gas molecules come off the surface of the dropping mirror 13 before carbon is generated. This effectively reduces the carbon contamination rate.

Further, the introduction unit 300 may introduce helium or the like during inspection of the sample 40. Thus, the contamination prevention method can be performed in parallel with the inspection of the sample 40. This improves productivity.

Further, the plasma generation device 310 is a remote plasma generation device. Thus, He plasma is generated in the plasma chamber 313 that is placed separately from the optical system chamber 100. Since the plasma chamber 313 and the optical system chamber 100 are connected by the introduction pipe 304, thermally loose coupling is achieved. Heat of the plasma generation device 310 is thereby not easily conducted to the optical system chamber 100, which maintains high accuracy of the optical system 10.

Furthermore, in the case where the sample 40 is an EUV mask with a pellicle, breakage of the pellicle is prevented. The reason is as follows.

A pellicle attached to an EUV mask is very thin and easily breakable, and one of its cause is electric charge on the pellicle. Since the pellicle is insulated, photoelectrons are released by irradiation of EUV light. When the photoelectrons are released from the pellicle, the pellicle is charged to a positive potential. In some cases, the pellicle can be damaged at the discharged position when charged to a high potential and discharged due to electrostatic discharge damage. Since a tensile stress is applied to the pellicle, the breakage can spread from the discharged position. Further, the pellicle can be broken as a result that an excessive force is applied to the pellicle by the Coulomb's force.

In this embodiment, the plasma 315 is introduced into the optical system chamber 100. When photoelectrons are released and the pellicle is charged to a positive potential, electrons in the plasma are absorbed in the pellicle and achieve neutralization. In this case, the potential of the pellicle is lowered by the floating potential in the plasma, which prevents electric discharge.

Further, He that is introduced by the introduction unit 300 may be neutral He molecules (He gas), not plasma. In this case also, the effect of eliminating residual gas from the chamber is attained.

Although He plasma is used in the above description, hydrogen plasma may be used instead. For example, hydrogen plasma may be used when the surface of the optical element is coated with a substance that is highly resistant to hydrogen radical, such as ruthenium. In the case of using hydrogen plasma, the mass of hydrogen is smaller than that of He, and ion bombardment effect is reduced accordingly, and therefore the voltage of the power supply 52 is set higher. This increases the velocity energy of ions and thereby effectively prevents contamination.

Further, hydrogen that is introduced into the optical system chamber 100 is not limited to hydrogen plasma, and it may be hydrogen gas, hydrogen radical or the like. The introduction unit 300 may mix gas, plasma, radical and the like and introduce them. In other words, the introduction unit 300 may introduce hydrogen or helium into the chamber.

A method for preventing contamination of an optical device according to an embodiment includes a step of introducing hydrogen or helium into a chamber, a step of applying a negative voltage to the optical element in the chamber, a step of measuring an ion current flowing to the optical element, and a step of adjusting the amount of hydrogen or helium introduced according to a measurement result of the ion current. This effectively prevents contamination of the optical element.

Although the optical element whose contamination is to be prevented is the dropping mirror 13 in the first embodiment, contamination of another optical element or optical component may be prevented. For example, contamination of the concave mirror 11, the concave mirror 12, the convex mirror 14 with a hole, or the convex mirror 15 may be prevented. In this case, a negative DC voltage is applied to the optical element whose contamination is to be prevented. A negative voltage may be simultaneously applied to two or more optical elements. This prevents contamination of two or more optical elements.

As described above, in this embodiment, the introduction unit 300 introduces hydrogen or helium to the optical system chamber 100. This effectively prevents contamination of the optical element. On the other hand, in the case of oxidizing and removing carbon by oxygen radical, high energy EUV light needs to be applied. Specifically, oxygen molecules need to be radically dissociated by activating the surface of the optical element or oxygen. However, it is difficult to apply the amount of light corresponding to the film thickness of carbon on the optical element surface, and therefore a result of removal is likely to be not uniform. Since a surface such as silicon is susceptible to oxidation by oxygen radical, silicon is exposed and oxidized after deposited carbon is removed, which can result in degradation of reflectance. Since this embodiment uses hydrogen or helium, contamination is prevented in a simple way.

Second Embodiment

Figure 2:
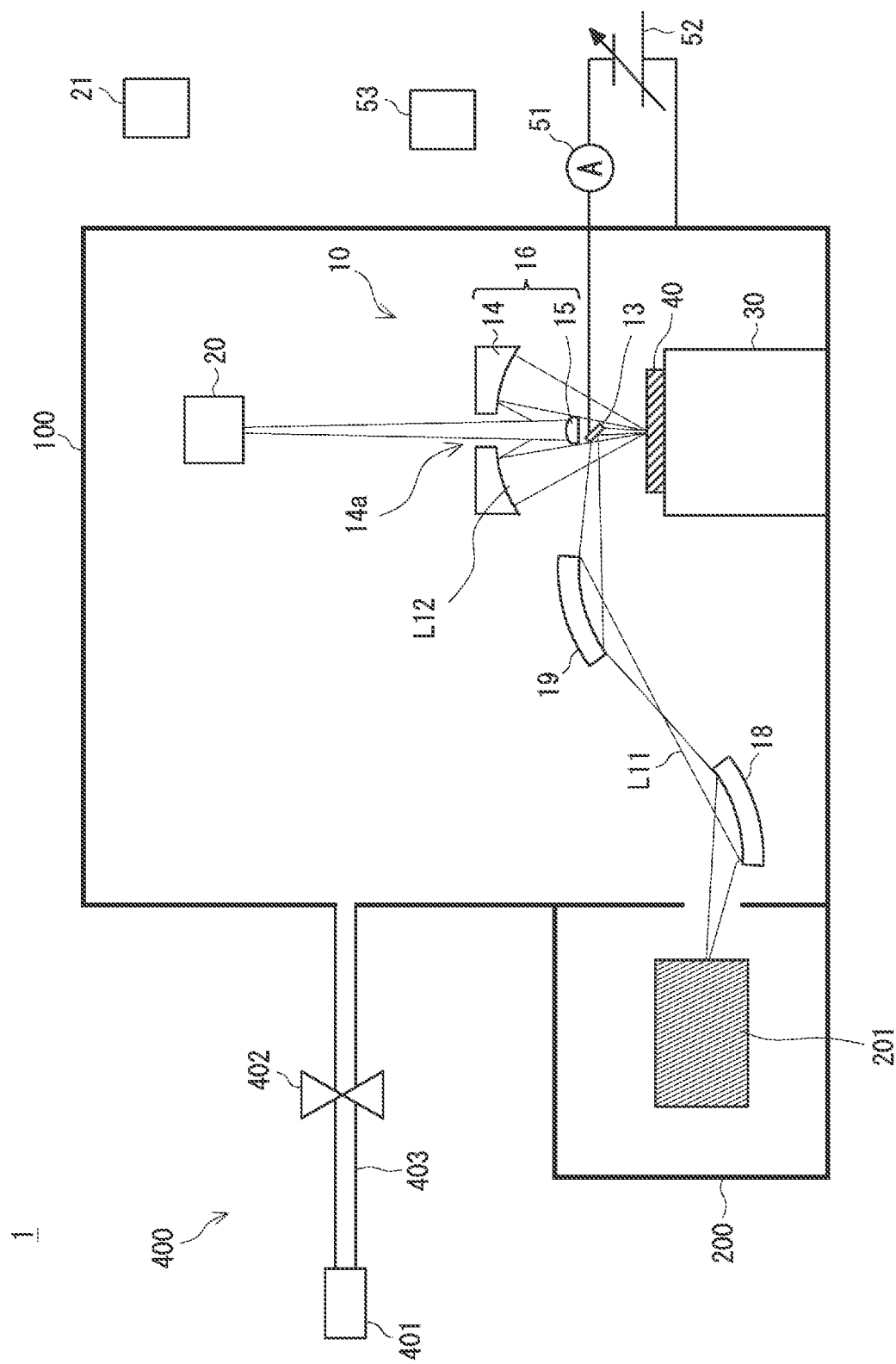
FIG. 2 is a schematic diagram showing the overall structure of an inspection device according to a second embodiment.

An optical device according to an embodiment will be described with reference to FIG. 2. FIG. 2 is a view showing an inspection device 1, which is an optical device. In FIG. 2, an introduction unit 400 is placed instead of the introduction unit 300 in FIG. 1. Further, a concave mirror 18 and a concave mirror 19 are placed instead of the concave mirror 11 and the concave mirror 12. The concave mirror 18 and the concave mirror 19 are oblique-incidence mirrors. The elements other than the introduction unit 400, the concave mirror 18, and the concave mirror 19 are the same as those in FIG. 1, and the description thereof is omitted as appropriate. For example, the Schwarzschild optical system 16 has the same structure as described in the first embodiment.

In this embodiment, the introduction unit 400 introduces He gas or hydrogen gas into the optical system chamber 100. The introduction unit 400 includes a gas supply unit 401, an MFC 402, and an introduction pipe 403.

The gas supply unit 401 includes a gas cylinder or the like, and supplies He gas or hydrogen gas ($H_2$ gas). It is assumed that the gas supply unit 401 supplies He gas. The gas supply unit 401 is connected to the introduction pipe 403. The gas supply unit 401 supplies He gas to the introduction pipe 403. The gas supply unit 401 may introduce hydrogen gas, or may introduce mixed gas of He gas and hydrogen gas.

The introduction pipe 403 is connected to the optical system chamber 100. Thus, He gas from the gas supply unit 401 is supplied to the optical system chamber 100 through the introduction pipe 403. Further, the introduction pipe 403 is provided with the MFC 402. The MFC 402 controls the flow rate of gas. The control unit 53 outputs a control signal to the MFC 402 on the basis of a measurement result of the ammeter 51. The MFC 402 controls the gas flow rate on the basis of the control signal.

The control unit 53 controls the amount of He gas introduced into the optical system chamber 100. For example, the pressure of the optical system chamber 100 is preferably about 1 to 10 Pa. Since He gas is used in this example, the MFC 402 supplies He gas so that the pressure of the optical system chamber 100 becomes 2 Pa. In the case of using hydrogen gas, the MFC 402 supplies hydrogen gas so that the pressure of the optical system chamber 100 becomes 4 Pa. The pressure of the chamber is not limited to the above values.

The concave mirror 18 and the concave mirror 19 are oblique-incidence mirrors. Thus, the optical axes of the irradiation light L11 before and after reflected on the concave mirror 18 are not orthogonal. On the other hand, since the concave mirror 11 in the first embodiment is tilted at 45 degrees to the optical axis of the irradiation light L11, the optical axes of the irradiation light L11 before and after reflected on the concave mirror 11 are orthogonal.

Likewise, the optical axes of the irradiation light L11 before and after reflected on the concave mirror 19 are not orthogonal. On the other hand, since the concave mirror 12 in the first embodiment is tilted at 45 degrees to the optical axis of the irradiation light L11, the optical axes of the irradiation light L11 before and after reflected on the concave mirror 12 are orthogonal.

The irradiation light L11 reflected on the concave mirror 18 and the concave mirror 19 enters the dropping mirror 13 in the same manner as in the first embodiment. The dropping mirror 13 reflects the irradiation light L11, and thereby the sample 40 is illuminated. This allows the photodetector 20 to take an image of the sample 40 as described in the first embodiment.

The concave mirrors 18 and 19, which are oblique-incidence mirrors, are metal mirrors. For example, the concave mirrors 18 and 19 are metal mirrors on which an Ru (ruthenium) film is formed. Since the concave mirrors 18 and 19 are metal mirrors, they reflect VUV light and EUV light from the light source 201. Thus, not only EUV light but also VUV light are guided to the dropping mirror 13. On the other hand, in the first embodiment, the concave mirror 11 and the concave mirror 12 are multi-layer mirrors, and therefore most of VUV light is not guided to the dropping mirror 13.

Use of oblique-incidence mirrors as the concave mirrors 18 and 19 allows VUV light to be guided to the dropping mirror 13. Thus, the irradiation light L11 reflected on the concave mirror 19 contains EUV light and VUV light. The concave mirror 19 focuses the irradiation light L11 on the sample 40. The irradiation light L11 reflected on the concave mirror 19 proceeds as being narrowed down, and therefore the light density of the irradiation light L11 is high in proximity to the dropping mirror 13. Further, He gas is supplied to the optical system chamber 100.

The VUV light contained in the irradiation light L11 is absorbed by the He gas. Then, He has ionizes and plasma is generated in proximity to the dropping mirror 13 with high light density. A negative DC voltage is applied to the dropping mirror 13 as in the first embodiment. Thus, He ions collide with the dropping mirror 13. Contamination is thereby prevented in the same manner as in the first embodiment.

Note that the control unit 53 controls the MFC 402 according to a measurement result of the ammeter 51. Specifically, the MFC 402 controls the gas flow rate so that the measurement result of the ammeter 51 reaches a target value. The amount of helium introduced into the optical system chamber 100 is thereby appropriately adjusted. This allows effectively preventing contamination.

In this embodiment, plasma is generated by using VUV light, which is out-of-bounds light generated in the light source 201. Thus, plasma is generated by the light source 201 for inspection. This eliminates the need for the plasma generation device 310, which allows simplification of the device structure. It is only necessary to add the introduction unit 400 that introduces helium gas or hydrogen gas, and an increase in device cost is thereby suppressed.

The introduction unit 400 may blow He gas off in proximity to the dropping mirror 13. In this case, a pipe of He gas may be placed inside the optical system chamber 100. This allows reducing the partial pressure of residual gas in proximity to the dropping mirror.

Further, use of He gas or He plasma reduces the effect of hydrogen radical on the optical element. For example, since some of hydrogen molecules absorb EUV light and are dissociated, they become hydrogen radical. Silicon can be etched by hydrogen radical. On the other hand, silicon cannot be etched by He, and therefore use of He enables use of silicon as an optical element material.

Third Embodiment

Figure 3:
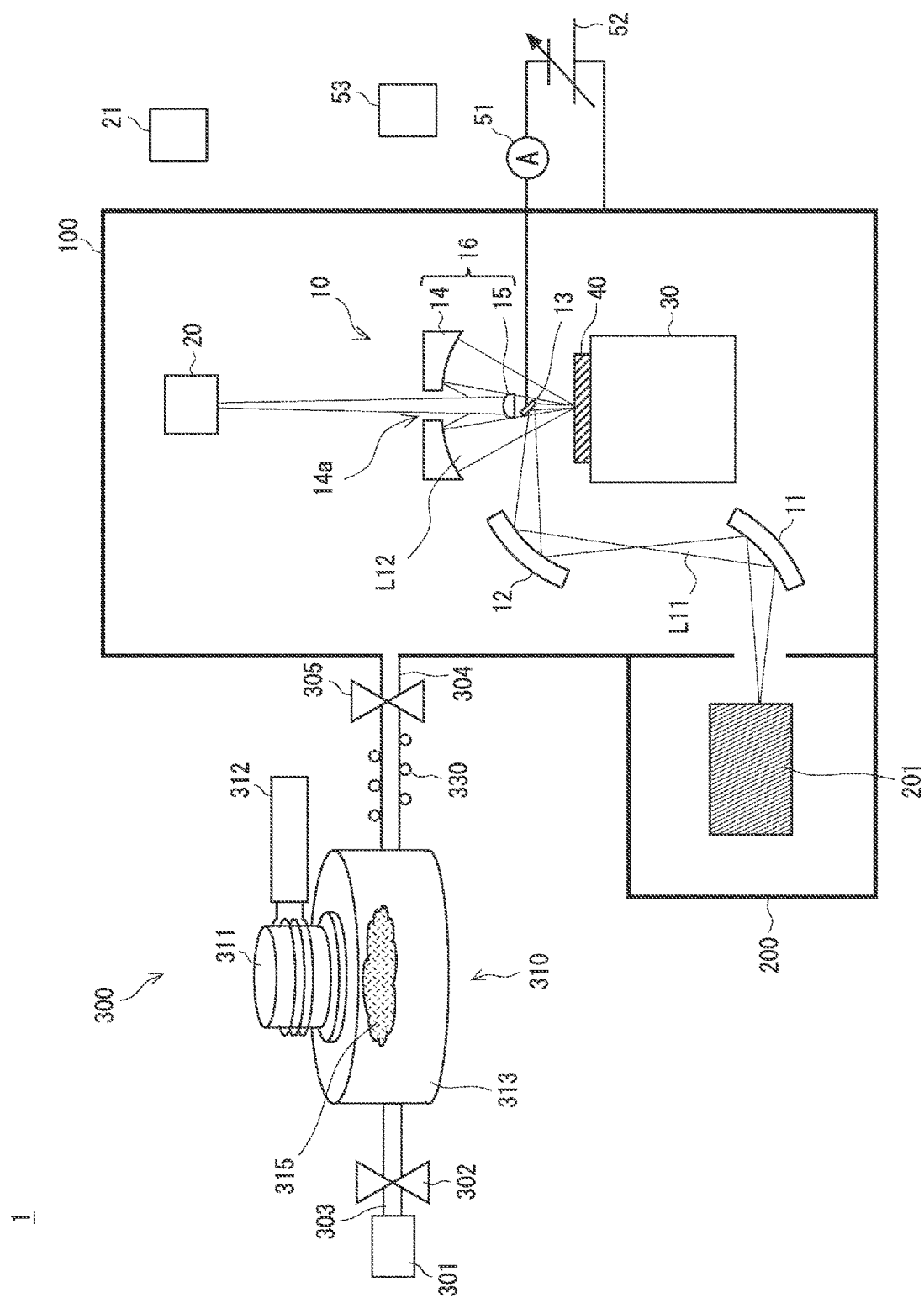
FIG. 3 is a schematic diagram showing the overall structure of an inspection device according to a third embodiment.

The configuration of an inspection device 1 according to an embodiment will be described with reference to FIG. 3. FIG. 3 is a view showing the structure of the inspection device 1. In this embodiment, a cooling mechanism 330 is added to the introduction unit 300 in addition to the structure shown in FIG. 1. The elements other than the cooling mechanism 330 are the same as those of the first embodiment, and the description thereof is omitted.

The cooling mechanism 330 includes a water cooling jacket through which cooling water flows, for example. The cooling mechanism 330 is mounted on the introduction pipe 304. The mounting position of the cooling mechanism 330 is not limited to the introduction pipe 304, and it may be mounted on the plasma chamber 313 or the like.

The cooling mechanism 330 cools the introduction pipe 304. This prevents heat generated in the plasma generation device 310 from being conducted to the optical system chamber 100. This allows stabilizing the temperature of the optical system chamber 100. Displacement of the optical system 10 due to thermal expansion is thereby inhibited, which enables accurate inspection.

The first to third embodiments can be combined as appropriate. For example, the concave mirrors 18 and 19, which are oblique-incidence mirrors, may be used in the first and second embodiments. Further, both of gas and plasma may be introduced. Specifically, the introduction unit 300 and the introduction unit 400 may be connected to the optical system chamber 100.

Although embodiments of the present disclosure are described in the foregoing, the present disclosure involves appropriate modifications without impairment of its object and effects and is not restricted to the above-described embodiments.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

The invention claimed is:

1. An optical device comprising:
   a light source configured to generate light containing EUV (Extreme UltraViolet) light or VUV (Vacuum UltraViolet) light;
   a chamber where an object to be irradiated with the light is placed;
   an optical element placed inside the chamber to guide the light;
   an introduction unit configured to introduce hydrogen or helium into the chamber;
   a power supply configured to apply a negative voltage to the optical element in the chamber;
   an ammeter configured to measure an ion current flowing through the optical element; and
   a control unit configured to adjust an amount of the hydrogen or the helium introduced according to a measurement result of the ammeter.

2. The optical device according to claim 1, wherein
   the introduction unit includes an introduction pipe connected to the chamber, and
   the control unit adjusts a gas flow rate of the hydrogen or the helium supplied to the introduction pipe.

3. The optical device according to claim 1, wherein
   the introduction unit includes
      a remote plasma generation device configured to generate plasma of the hydrogen or the helium,
      an introduction pipe placed between the remote plasma generation device and the chamber, and
      a variable conductance valve mounted on the introduction pipe, and
   the control unit adjusts conductance of the variable conductance valve.

4. The optical device according to claim 3, further comprising:
   a cooling mechanism configured to cool the introduction pipe.

5. The optical device according to claim 1, wherein the object is an EUV mask with a pellicle.

6. The optical device according to claim 1, wherein
   an oblique-incidence mirror configured to reflect the VUV light is placed inside the chamber, and
   the VUV light reflected on the oblique-incidence mirror enters the optical element.

7. The optical device according to claim 1, wherein the introduction unit introduces helium gas or helium plasma into the chamber.

8. A method for preventing contamination of an optical device including a light source configured to generate light containing EUV light or VUV light, a chamber where an object to be irradiated with the light is placed, and an optical element placed inside the chamber to guide the light, the method comprising:
   a step of introducing hydrogen or helium into the chamber;
   a step of applying a negative voltage to the optical element in the chamber;
   a step of measuring an ion current flowing through the optical element; and
   a step of adjusting an amount of the hydrogen or the helium introduced according to a measurement result of the ion current.

9. The method for preventing contamination of an optical device according to claim 8, wherein
   an introduction pipe is connected to the chamber, and
   a gas flow rate of the hydrogen or the helium supplied to the introduction pipe is adjusted according to the measurement result.

10. The method for preventing contamination of an optical device according to claim 8, wherein
    the optical device includes
       a remote plasma generation device configured to generate plasma of the hydrogen or the helium,
       an introduction pipe placed between the remote plasma generation device and the chamber, and
       a variable conductance valve mounted on the introduction pipe, and
    conductance of the variable conductance valve is adjusted according to the measurement result.

11. The method for preventing contamination of an optical device according to claim 10, wherein a cooling mechanism configured to cool the introduction pipe is placed in the optical device.

12. The method for preventing contamination of an optical device according to claim 8, wherein the object is an EUV mask with a pellicle.

13. The method for preventing contamination of an optical device according to claim 8, wherein
    an oblique-incidence mirror configured to reflect the VUV light is placed inside the chamber, and
    the VUV light reflected on the oblique-incidence mirror enters the optical element.

14. The method for preventing contamination of an optical device according to claim 8, wherein helium gas or helium plasma is introduced into the chamber.

* * * * *